(12) United States Patent
Tao et al.

(10) Patent No.: US 6,515,912 B1
(45) Date of Patent: Feb. 4, 2003

(54) SEMICONDUCTOR DEVICE

(75) Inventors: Guoqiao Tao, Nijmegen (NL); Johannes Dijkstra, Nijmegen (NL); Robertus Dominicus Joseph Verhaar, Nijmegen (NL); Thomas James Davies, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 105 days.

(21) Appl. No.: 10/018,156

(22) PCT Filed: Apr. 10, 2001

(86) PCT No.: PCT/EP01/04078

§ 371 (c)(1),
(2), (4) Date: Dec. 10, 2001

(87) PCT Pub. No.: WO01/80247

PCT Pub. Date: Oct. 25, 2001

(30) Foreign Application Priority Data

Apr. 14, 2000 (EP) .............................................. 00201354

(51) Int. Cl.$^7$ ............................................... G11C 16/00
(52) U.S. Cl. ............................ 365/185.28; 365/185.18; 365/185.29
(58) Field of Search ....................... 365/185.28, 185.29, 365/185.18, 185.05

(56) References Cited

U.S. PATENT DOCUMENTS

| | | | | |
|---|---|---|---|---|
| 5,742,542 A | * | 4/1998 | Lin et al. ................ | 365/185.08 |
| 5,761,116 A | | 6/1998 | Li et al. ................... | 365/185.1 |
| 6,009,033 A | * | 12/1999 | Li et al. ................. | 365/185.29 |
| 6,208,599 B1 | * | 3/2001 | Tu et al. ................. | 365/185.29 |
| 6,294,810 B1 | * | 9/2001 | Li et al. ................. | 365/185.28 |

OTHER PUBLICATIONS

K. Naruke et al. "Stress induced leakage current limiting to scale down EEPROM tunnel oxide thickness", IEDM 1988, pp. 424–427.

* cited by examiner

Primary Examiner—Tan T. Nguyen
(74) Attorney, Agent, or Firm—Aaron Waxler

(57) ABSTRACT

A semiconductor device comprising a memory cell, which memory cell comprises:

a write transistor ($T_{WR}$)

a read transistor ($T_{RE}$), a sense transistor ($T_{SE}$) provided with a sense transistor gate, a first sense transistor electrode (7) and a second sense transistor electrode (3), the first sense transistor electrode (7) being connected to a read transistor electrode (9), the sense transistor gate being arranged as a floating gate (FG), said floating gate being separated from the second sense electrode (3) by a sense transistor oxide layer (THINOX) and from a write transistor electrode (1) by a tunnel oxide layer (TUNOX);

a voltage source arrangement (5, Vsi_p, Vsi_e) to provide the second sense transistor electrode (3) with a predetermined voltage during programming and erasing, such that no stress induced leakage current occurs in the sense transistor oxide layer (THINOX).

11 Claims, 3 Drawing Sheets

SEMICONDUCTOR DEVICE

FIELD OF THE INVENTION

The present invention relates to a semiconductor device comprising a memory cell, which memory cell comprises:
- a write transistor provided with a write transistor gate, a first write transistor electrode and a second write transistor electrode,
- a read transistor provided with a read transistor gate, a first read transistor electrode and a second read transistor electrode,
- a sense transistor provided with a sense transistor gate, a first sense transistor electrode and a second sense transistor electrode, the first sense transistor electrode being connected to the second read transistor electrode, the sense transistor gate being arranged as a floating gate, said floating gate being separated from the second sense electrode by a sense transistor oxide layer and from the second write transistor electrode by a tunnel oxide layer.

BACKGROUND OF THE INVENTION

Such a semiconductor device is known from U.S. Pat. No. 5,761,116. FIG. 1 shows a basic electrical circuit for a memory cell known from this prior art document. The electrical circuit shows three transistors: a write transistor $T_{WR}$, a read transistor $T_{RE}$, and a sense transistor $T_{SE}$.

The write transistor $T_{WR}$ is provided with a drain and a source as indicated in FIG. 1. The drain is connected to a write bit line $BL_{WR}$. The substrate of the write transistor $T_{WR}$ is grounded. The write transistor $T_{WR}$ is provided with a gate connected to a write word line $WL_{WR}$.

The read transistor $T_{RE}$ is provided with a drain and a source as indicated in FIG. 1. The drain is connected to a read bit line $BL_{RE}$. The substrate of the read transistor $T_{RE}$ is grounded. The read transistor $T_{RE}$ is provided with a gate connected to a read word line $WL_{RE}$.

The sense transistor $T_{SE}$ is provided with a drain and a source 3 as shown in FIG. 1. The drain of the sense transistor $T_{SE}$ is connected to the source of the read transistor $T_{RE}$. The substrate of the sense transistor $T_{SE}$ is grounded. The gate of the sense transistor $T_{SE}$ is connected to a floating gate FG.

The floating gate FG is separated from the source of the write transistor $T_{WR}$ by a thin tunnel oxide layer TUNOX.

Moreover, a control gate CG is provided, which is separated from the floating gate FG by a control gate oxide layer (or gate dielectric).

The operation of this prior art memory cell is summarized in table 1 below.

TABLE 1

| Operation | $WL_{WR}$ | $BL_{WR}$ | CG | $WL_{RE}$ | $BL_{RE}$ | $V_3$ | Substrate |
|---|---|---|---|---|---|---|---|
| program | Vpp | Vpp | 0 | 0 | float | 0 | 0 |
| erase | Vpp | Vpp | Vpp | Vcc | 0 | 0 | 0 |
| read | Vcc | 0 | 0 | Vcc | Vsense | 0 | 0 |

Vpp = 10–12 V
Vcc = 13–15 V
Vsense = ±1.5 V

In the semiconductor device according to U.S. Pat. No. 5,761,116, the thicknesses of both the tunnel oxide layer TUNOX and the sense transistor oxide layer THINOX are about 8.0 nm (80 Å).

In general, embedded semiconductor non-volatile memories often require a high reliability, a fast access time, and a low power consumption during programming and erasing operations. One of the ways to gain high speed is to scale down oxide layer thicknesses. However, a stress induced leakage current sets a lower limit for the sense transistor oxide layer THINOX and the tunnel oxide layer TUNOX. Reference is also made to K. Naruke et al. "Stress induced leakage current limiting to scale down EEPROM tunnel oxide thickness", IEDM 1988, pages 424–427.

SUMMARY OF THE INVENTION

The object of the present invention is to provide a semiconductor device comprising a memory cell arrangement which inhibits SILC development in the sense transistor oxide layer THRNOX and thus reduces the lower limits of EEPROM gate oxides.

This object is achieved by means of a semiconductor device comprising a memory cell as defined at the outset wherein the memory cell comprises a voltage source arrangement arranged to provide the second sense transistor electrode with a predetermined voltage during programming and erasing, such that substantially no stress induced leakage current occurs in the sense transistor oxide layer.

By applying such an additional predetermined voltage to the second sense transistor electrode during programming and erasing, the voltage across the sense transistor oxide layer may be kept at such a low level that no (or substantially no) SILC occurs. This opens up the possibility to apply logic gate oxides in EEPROM devices and to make the processes and devices more compatible.

This basic idea is applicable both in single and double poly processes.

The sense transistor oxide layer and the tunnel oxide layer may have thicknesses between 5.0 and 10.0 run, preferably, however, between 6.0 and 9.0 run.

The predetermined voltage to be applied to the sense transistor oxide layer is preferably between 0.5 and 3.6 Volt.

The present invention also relates to a memory cell structure comprising a plurality of memory cells, each memory cell comprising:
- a write transistor provided with a write transistor gate, a first write transistor electrode and a second write transistor electrode,
- a read transistor provided with a read transistor gate, a first read transistor electrode and a second read transistor electrode,
- a sense transistor provided with a sense transistor gate, a first sense transistor electrode and a second sense transistor electrode, the first sense transistor electrode being connected to the second read transistor electrode, the sense transistor gate being arranged as a floating gate, said floating gate being separated from the second sense electrode by a sense transistor oxide layer and from the second write transistor electrode by a tunnel oxide layer;

wherein a voltage source arrangement is arranged to provide the second sense transistor electrode of at least one selected memory cell with a predetermined voltage during programming and erasing, such that substantially no stress induced leakage current occurs in the sense transistor oxide layer of the at least one memory cell.

The present invention also relates to a method of controlling a memory cell, the memory cell comprising:
- a write transistor provided with a write transistor gate, a first write transistor electrode and a second write transistor electrode, a read transistor provided with a read transistor gate, a first read transistor electrode and a second read transistor electrode, a sense transistor provided with a sense transistor gate, a first sense transistor electrode and a second sense transistor electrode, the first sense transistor electrode being connected to the second read transistor electrode, the sense transistor gate being arranged as a floating gate, said floating gate being separated from the second sense electrode by a sense transistor oxide layer and from the second write transistor electrode by a tunnel oxide layer;

wherein the method comprises the step of controlling a voltage source arrangement to provide the second sense transistor electrode with a predetermined voltage during programming and erasing, such that substantially no stress induced leakage current occurs in the sense transistor oxide layer.

Finally, the present invention relates to a method of controlling a memory cell structure comprising:

a write transistor provided with a write transistor gate, a first write transistor electrode and a second write transistor electrode, a read transistor provided with a read transistor gate, a first read transistor electrode and a second read transistor electrode, a sense transistor provided with a sense transistor gate, a first sense transistor electrode and a second sense transistor electrode, the first sense transistor electrode being connected to the second read transistor electrode, the sense transistor gate being arranged as a floating gate, said floating gate being separated from the second sense electrode by a sense transistor oxide layer and from the second write transistor electrode by a tunnel oxide layer;

wherein the method comprises the steps of:

selecting at least one predetermined memory cell controlling the voltage source arrangement to provide the second sense transistor electrode of the at least one predetermined memory cell with a predetermined voltage during programming and erasing, such that substantially no stress induced leakage current occurs in the sense transistor oxide layer of the at least one predetermined memory cell.

BRIEF DESCRIPTION OF THE DRAWINGS

Below the present invention will be illustrated with reference to some drawings, which are shown only to explain the present invention and not to limit its scope. The scope of the present invention is only limited by the annexed claims.

DETAILED DESCRIPTION OF THE EMBODIMENTS

Figure 1:
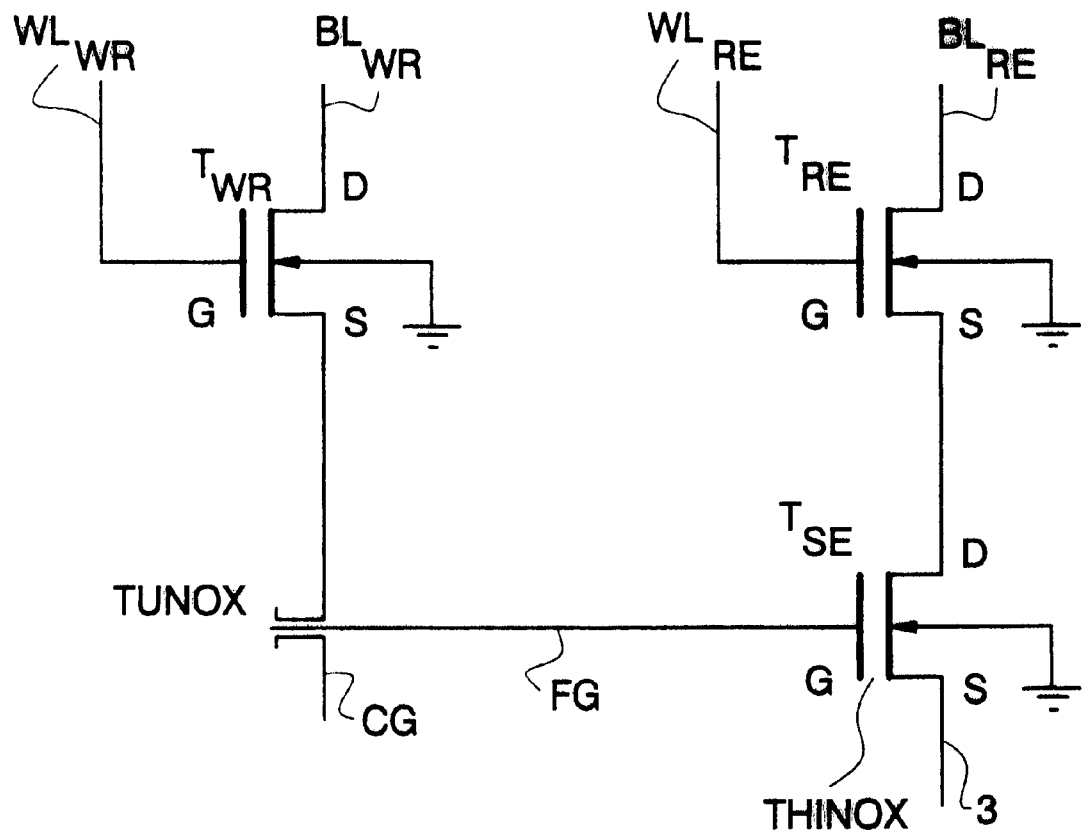
FIG. 1 shows an electrical circuit of a memory cell according to the prior art.

FIG. 1 has been explained above.

Figure 2:
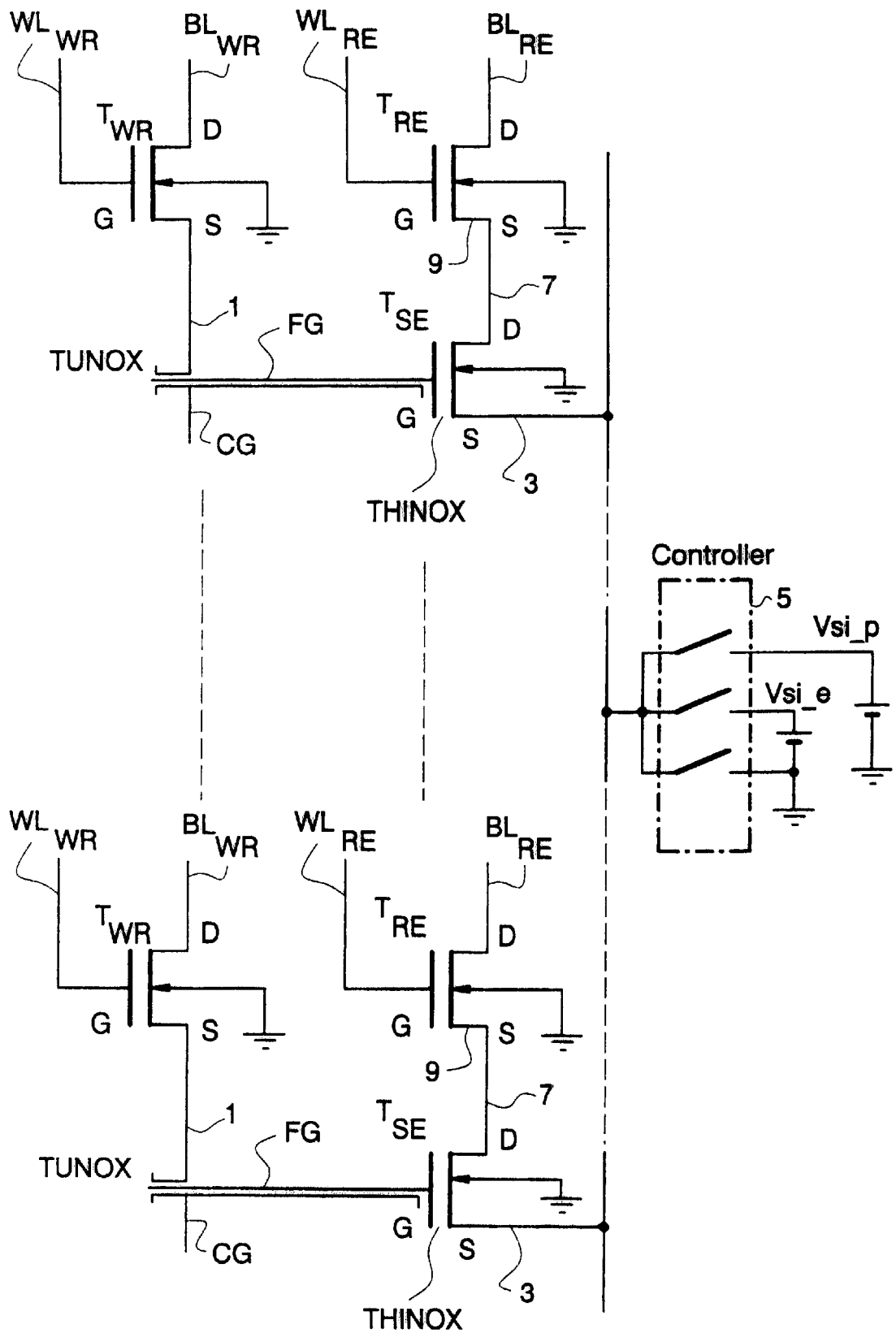
FIG. 2 shows an electrical circuit of memory cells according to the invention.

FIG. 2 shows two memory cells controlled by an electrical circuit according to the invention. The memory cells according to FIG. 2 differ from the one shown in FIG. 1 in that the control gate CG is made by a double poly process. In FIG. 2 like reference numbers refer to the same components as in FIG. 1.

FIG. 2 shows the application of a voltage source arrangement with two voltage sources Vsi_p, Vsi_e to two memory cells. Of course, more memory cells can be provided and connected to these voltage sources. There may also be other groups of memory cells on the same chip that are controlled by other, similar voltage sources. The voltage sources Vsi_p, Vsi_e are connected to a controller 5. The controller 5 may be provided with switches, as shown, or transistors (not shown) and programmed so as to connect the sources 3 of one or more sense transistors $T_{SE}$ to either Vsi_p, Vsi-E, or ground, respectively, during programming, erasing and reading, respectively, of the memory cell.

It is to be understood that voltage sources Vsi_p, Vsi_e and controller 5 have been shown very schematically. They are intended to show that means need to be applied that control the voltage on source electrodes 3 of one or more selected memory cells during programming, erasing, and reading.

Figure 3:
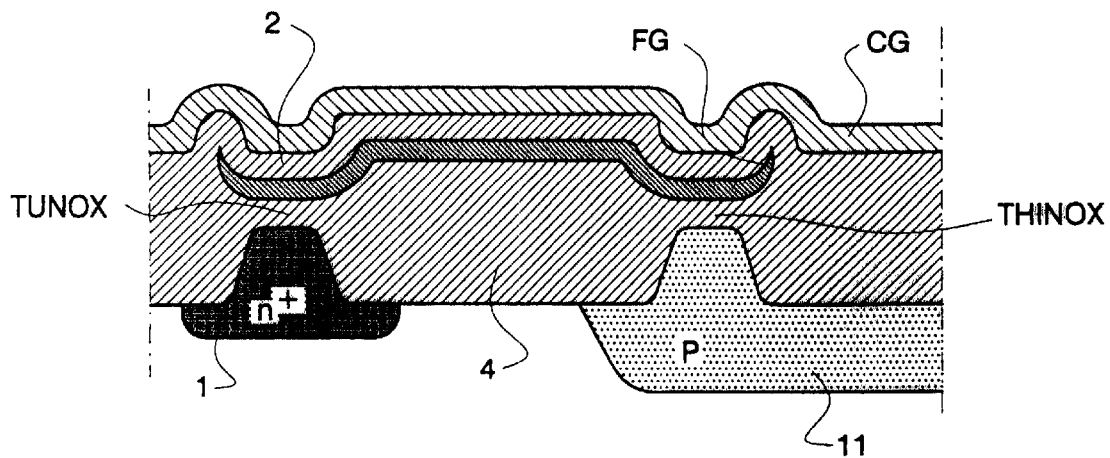
FIG. 3 shows a cross section of the semiconductor structure of a portion of the memory cell according to FIG. 2.

FIG. 3 shows a cross section of a portion of one of the memory cells according to FIG. 2. On the left-hand side of FIG. 3, a $n_+$well 1 is shown, which is connected to the source of the write transistor $T_{WR}$. On the right-hand side of FIG. 3, a p well 11 is shown, which is the substrate of the sense transistor $T_{SE}$. Between the $n_+$well 1 and the p well 11 there is a thick oxide layer 4 to isolate the write transistor $T_{WR}$ and the sense transistor $T_{SE}$ from one another.

FIG. 3 shows the floating gate FG arranged above the $n_+$well 1 and the p well 11. The floating gate FG is separated from the $n_+$well 1 by the tunnel oxide layer TUNOX and from the p well 11 by the sense transistor oxide layer THINOX. Since the tunnel oxide layer TUNOX and the sense transistor oxide layer THINOX are produced in the same manufacturing step they have substantially the same thicknesses. Nowadays these thicknesses are about 7.5 nm (75 Å). 1t is envisaged, however, that this thickness will be reduced in the future.

The floating gate FG is made of a first polysilicon layer. A control gate oxide layer 2 (or stack of dielectric layers) is deposited on the floating gate FG. A second polysilicon layer CG is deposited on the control gate oxide layer 2. This second polysilicon layer is used as the control gate for the purpose of erasing the memory cells.

When operated in accordance with the prior art, i.e., without the voltage source arrangement 5, Vsi_p, Vsi_e, the operation of the memory cells shown in FIGS. 2 and 3 would be as shown in table 2 below.

TABLE 2

| Operation | Program (select/not-sel) | Erase (select/not-sel) | Read (select/not-sel) |
|---|---|---|---|
| $WL_{WR}$ | Vpp + Vtb/Ground | >Vt/Ground | Don't care |
| $BL_{WR}$ | Vpp/Ground | Ground | Ground |
| CG | Ground | Vpp | Vcg_read (e.g. 1 V) |
| $WL_{RE}$ | Don't care/Ground | Don't care/Ground | Vcc |
| $BL_{RE}$ | Ground | Ground | Vbl_read (e.g. 1 V) |
| $V_3$ | Ground or floating | Ground or floating | Ground |
| Substrate | Ground | Ground | Ground |

Vpp + Vtb = 13–15 V

TABLE 2-continued

| Operation | Program (select/not-sel) | Erase (select/not-sel) | Read (select/not-sel) |
|---|---|---|---|

Vpp = 10–12 V
Vt = 0.3–0.8 V, typically 0.6 V (threshold voltage of $T_{WR}$)

In table 2, Vpp, which is e.g. 12 V, is the program voltage. Vtb is the threshold voltage of the write transistor $T_{WR}$ with back bias. A typical value for Vtb is 2.5 V; a typical range for Vtb is 1–4 V. Vcc is the power supply voltage of a logic part (not shown) which is assumed to be larger than Vbl_read +Vt. Vbl_read and Vcg_read are the voltages on the bit line and the control gate CG, respectively, during a read operation. The latter voltages are usually optimized for read current and read disturbance and are, e.g., 1 V.

As mentioned above, the tunnel oxide layer TUNOX and the sense transistor oxide layer THINOX are preferably made in the same process step. Sometimes, this results in the sense transistor oxide layer THINOX even being slightly thinner than the tunnel oxide layer TUNOX. In such a case, the sense transistor $T_{SE}$ area can also contribute to the programming and erase current. In other words, the sense transistor oxide layer THINOX is also stressed during programming and erasing.

The possible electron flows are: during (excessive) programming electrons flow from the floating gate FG through the tunnel oxide layer TUNOX to the source of the write transistor $T_{WR}$. However, since the sense transistor oxide layer THINOX is as thin as TUNOX and the voltage $V_3$ of the source 3 (as shown in FIG. 2) of the sense transistor $T_{SE}$ is at ground potential (or floating) also electrons may flow from the source 3 of the sense transistor $T_{SE}$ to floating gate FG and from there further into the tunneling region towards the source 1 of the write transistor $T_{WR}$. During erasing, electrons will flow through both the tunnel oxide layer TUNOX and the sense transistor oxide layer THINOX into the floating gate FG since they are attracted by the high voltage on the control gate CG. Therefore, during programming as well as erasing, the sense transistor oxide layer THINOX is subject to a uni-polar stress since electrons are injected from the substrate into the floating gate FG. As a result, a stress induced leakage current SILC in the sense transistor oxide layer THINOX occurs, which can be even more serious than in the tunnel oxide layer TUNOX. This may cause serious retention problems, especially after a large number of programming and erasing cycles.

To solve these problems, the inventor has found out that a SILC inhibit voltage may be introduced into the read path. This reduces the electric field across the sense transistor oxide layer THINOX during both programming and erasing, such that the sense transistor oxide layer THINOX is no longer stressed or substantially less stressed.

Below, in table 3, the novel proposed operation scheme is shown.

TABLE 3

| Operation | Program (select/not-sel) | Erase (select/not-sel) | Read (select/not-sel) |
|---|---|---|---|
| $WL_{WR}$ | Vpp + Vtb/Ground | >Vt/Ground | Don't care |
| $BL_{WR}$ | Vpp/Ground | Ground | Ground |
| CG | Ground | Vpp | Vcg_read (e.g. 1 V) |
| $WL_{RE}$ | Ground | Ground | Vcc |
| $BL_{RE}$ | Ground (or floating) | Ground (or floating) | Vbl_read (e.g. 1 V) |
| $V_3$ | Vsi_p (e.g. 1 V) | Vsi_e (e.g. 1 V) | Ground |
| Substrate | Ground | Ground | Ground |

The SILC inhibit voltages Vsi_p and Vsi_e during programming and erasing, respectively, should be optimized for a particular memory cell with regard to Vpp, the tunnel oxide layer thickness and the sense transistor oxide layer thickness. Table 3 mentions 1V as an example. A proper range is 0.5 to 3.6V.

It is to be understood that the read transistor $T_{RE}$ may alternatively be located on the source side of the sense transistor $T_{SE}$. Then, the SILC inhibit voltage should be applied to the drain of the sense transistor $T_{SE}$ instead of to its source.

It should also be understood that the terms "programming" and "erasing" can be reversed since "programming" and "erasing" only depend on a convention that relates to a memory cell being either charged or not. Such a convention can be reversed.

Figure 4:
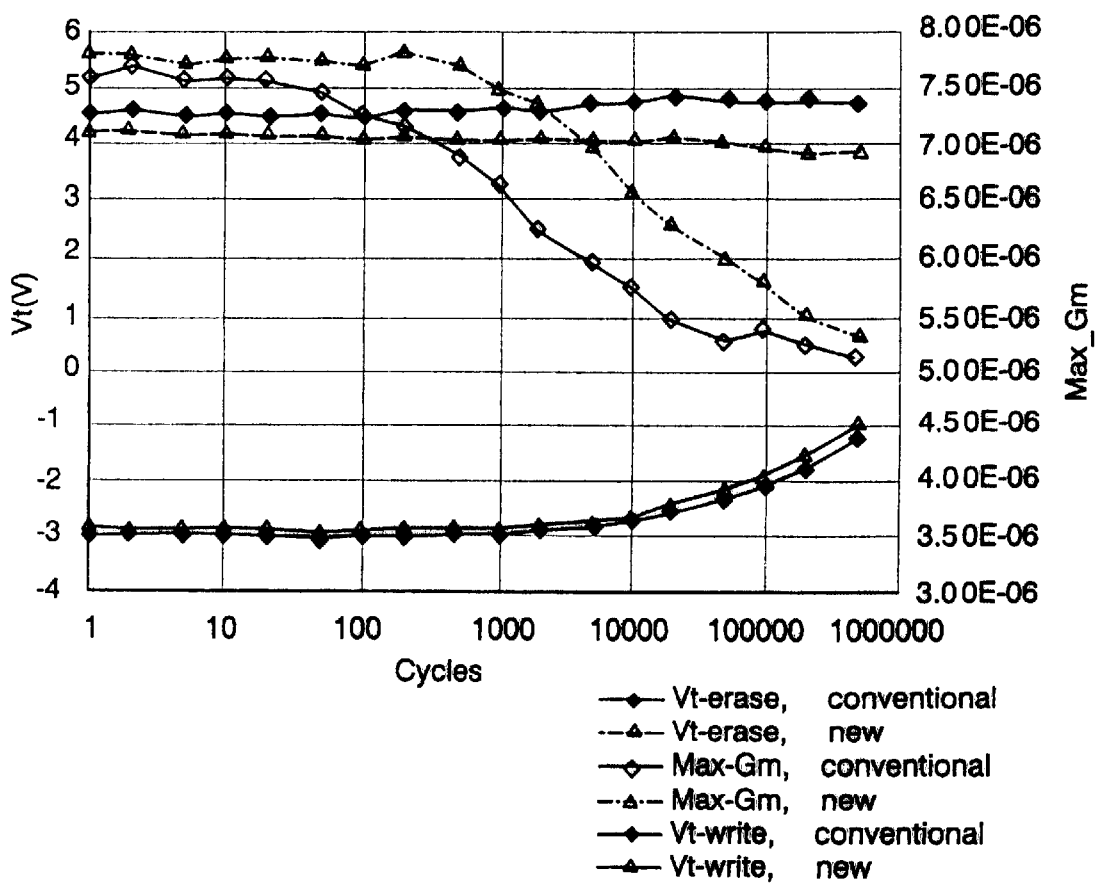
FIG. 4 shows several curves representing endurance and maximum transconductance degradation of an EEPROM cell with and without SILC inhibit feature.

Some experiments have been carried out to check the influence of the operation scheme as proposed in table 3. Cells have been made in 0.35 μm generation processes. The maximum transconductance, indicated by Max_Gm, was used to monitor the degradation of the cell read path. FIG. 4 shows the difference between two memory cells on a same wafer under the conventional scheme (indicated by diamonds) and the new SILC inhibit scheme (indicated by triangles).

From FIG. 4, it is evident that, using the same Max_Gm degradation criterion, the SILC inhibit scheme yields more than 10 times larger cycle numbers. It is expected that after optimization this scheme can be improved even more. It is noted that there is no clear difference between the endurance characteristics shown in FIG. 4, i.e., the threshold voltages of the write transistor $T_{WR}$ during writing and erasing, respectively, indicated by VthWRT and VthERS, respectively.

The invention as explained above is applicable to both double poly processes and single poly processes. Moreover, it is not only applicable to EEPROMS, but also to flash memories where the tunnel region and the sense transistor oxide region can be separated from one another. In flash memories, the operation conditions may need modification.

Although the present invention has been explained with reference to an $n_+$well 1 for the source region of the write transistor $T_{WR}$ and a p well 3 for the source region of the sense transistor $T_{SE}$, it is to be understood that all polarities of the regions in the semiconductor substrate may be reversed.

Although FIGS. 1 and 2 show only one memory cell, it is evident that the invention is also applicable to memory cell arrays in which one or more voltage sources $V_S$ generate suitable voltages for the sources (drains) of the sense transistor.

What is claimed is:

1. A semiconductor device comprising a memory cell , which memory cell comprises:
    a write transistor ($T_{WR}$) provided with a write transistor gate, a first write transistor electrode and a second write transistor electrode (1), a read transistor ($T_{RE}$) provided with a read transistor gate, a first read transistor electrode and a second read transistor electrode (9), a sense transistor ($T_{SE}$) provided with a sense transistor gate, a first sense transistor electrode (7) and a second sense transistor electrode (3), the first sense transistor electrode (7) being connected to the second read transistor electrode (9), the sense transistor gate being arranged as a floating gate (FG), said floating gate being separated from said second sense electrode (3) by a sense transistor oxide layer (THINOX) and from said second write transistor electrode (1) by a tunnel oxide layer (TUNOX);

wherein a voltage source arrangement (5, Vsi_p, Vsi_e) is arranged to provide said second sense transistor electrode (3) with a predetermined voltage which is different from ground voltage, during programming and erasing, such that substantially no stress induced leakage current occurs in said sense transistor oxide layer (THINOX).

2. A semiconductor device according to claim 1, wherein a control gate (CG) is provided, separated from said floating gate by a control gate dielectric layer (2).

3. A semiconductor device according to claim 2, wherein said control gate (CG) is made of a poly silicon layer other than that used for the floating gate (FG).

4. A semiconductor device according to claim 1, wherein said write transistor gate and said read transistor gate are separately controlled.

5. A semiconductor device according to claim 1, wherein said sense transistor oxide layer (THINOX) and said tunnel oxide layer (TUNOX) have thicknesses between 5.0 and 10.0 nm.

6. A semiconductor device according to claim 5, wherein said sense transistor oxide layer (THINOX) and said tunnel oxide layer (TUNOX) have thicknesses between 6.0 and 8.0 nm.

7. A semiconductor device according to claim 1, wherein said predetermined voltage (Vsi_p, Vsi_e) is between 0.5 and 3.6 V.

8. A memory cell structure comprising a plurality of memory cells, each memory cell comprising:

a write transistor ($T_{WR}$) provided with a write transistor gate, a first write transistor electrode and a second write transistor electrode (1), a read transistor ($T_{RE}$) provided with a read transistor gate, a first read transistor electrode and a second read transistor electrode (9), a sense transistor ($T_{SE}$) provided with a sense transistor gate, a first sense transistor electrode (7) and a second sense transistor electrode (3), the first sense transistor electrode (7) being connected to the second read transistor electrode (9), the sense transistor gate being arranged as a floating gate (FG), said floating gate being separated from said second sense electrode (3) by a sense transistor oxide layer (THINOX) and from said second write transistor electrode (1) by a tunnel oxide layer (TUNOX);

wherein a voltage source arrangement (5, Vsi_p, Vsi_e) is arranged to provide said second sense transistor electrode (3) of at least one selected memory cell with a predetermined voltage which is different from ground voltage, during programming and erasing, such that substantially no stress induced leakage current occurs in said sense transistor oxide layer (THINOX) of said at least one selected memory cell.

9. A method according to claim 8, wherein said sense transistor oxide layer and said tunnel oxide layer are made in a same manufacturing step.

10. A method of controlling a memory cell, said memory cell comprising:

a write transistor ($T_{WR}$) provided with a write transistor gate, a first write transistor electrode and a second write transistor electrode (1), a read transistor ($T_{RE}$) provided with a read transistor gate, a first read transistor electrode and a second read transistor electrode (9), a sense transistor ($T_{SE}$) provided with a sense transistor gate, a first sense transistor electrode (7) and a second sense transistor electrode (3), the first sense transistor electrode (7) being connected to the second read transistor electrode (9), the sense transistor gate being arranged as a floating gate (FG), said floating gate being separated from said second sense electrode (3) by a sense transistor oxide layer (THINOX) and from said second write transistor electrode (1) by a tunnel oxide layer (TUNOX);

wherein the method comprises the step of controlling a voltage source arrangement (5, Vsi_p, Vsi_e) to provide said second sense transistor electrode (3) with a predetermined voltage which is different from ground voltage, during programming and erasing, such that substantially no stress induced leakage current occurs in said sense transistor oxide layer (THINOX).

11. A method of controlling a memory cell structure comprising a plurality of memory cells, each memory cell comprising:

a write transistor ($T_{WR}$) provided with a write transistor gate, a first write transistor electrode and a second write transistor electrode (1), a read transistor ($T_{RE}$) provided with a read transistor gate, a first read transistor electrode and a second read transistor electrode (9), a sense transistor ($T_{SE}$) provided with a sense transistor gate, a first sense transistor electrode (7) and a second sense transistor electrode (3), the first sense transistor electrode (7) being connected to the second read transistor electrode (9), the sense transistor gate being arranged as a floating gate (FG), said floating gate being separated from said second sense electrode (3) by a sense transistor oxide layer (THINOX) and from said second write transistor electrode (1) by a tunnel oxide layer (TUNOX);

wherein the method comprises the steps of:

selecting at least one predetermined memory cell controlling a voltage source arrangement ($V_S$) to provide said second sense transistor electrode (3) of said at least one predetermined memory cell with a predetermined voltage which is different from ground voltage, during programming and erasing, such that substantially no stress induced leakage current occurs in said sense transistor oxide layer (THINOX) of said at least one predetermined memory cell.

* * * * *